United States Patent [19]

Worrell et al.

[11] Patent Number: 5,977,481
[45] Date of Patent: Nov. 2, 1999

[54] FACEPLATE WITH PROVISION FOR OPTIONAL ICONS

[75] Inventors: John F. Worrell, Kernersville; James E. Crompton, III, Pfafftown, both of N.C.

[73] Assignee: The Whitaker Corporation, Wlmington, Del.

[21] Appl. No.: 08/985,672

[22] Filed: Dec. 5, 1997

[51] Int. Cl.[6] .................................................. H05K 5/03
[52] U.S. Cl. ............................... 174/66; 220/241; 40/622
[58] Field of Search ............................. 174/66; 220/241, 220/3.8; 40/618, 622; 439/491, 488

[56] References Cited

U.S. PATENT DOCUMENTS

| | | | |
|---|---|---|---|
| 1,930,610 | 10/1933 | Despard | 174/66 X |
| 3,438,534 | 4/1969 | Zerwes | 220/241 |
| 4,707,564 | 11/1987 | Gonzales | 174/66 |
| 5,594,206 | 1/1997 | Klas et al. | 174/66 X |
| 5,613,874 | 3/1997 | Orlando et al. | 439/491 |
| 5,735,708 | 4/1998 | Arnett et al. | 439/491 |

*Primary Examiner*—Dean A. Reichard
*Attorney, Agent, or Firm*—Robert J. Kapalka

[57] ABSTRACT

A faceplate for communications equipment includes a plate member having an opening for access to a communications port, and an icon mounting stall associated with the opening. The icon mounting stall includes a cavity in the plate member which is covered by a membrane along the front face of the plate member. The membrane is integrally formed in the plate member and is relatively thinner than the plate member. The membrane is puncturable to permit reception of an icon in the mounting stall.

20 Claims, 3 Drawing Sheets

FACEPLATE WITH PROVISION FOR OPTIONAL ICONS

FIELD OF THE INVENTION

The invention relates to a system for mounting icons on a faceplate or other device.

BACKGROUND OF THE INVENTION

Some faceplates which are used in communications systems have a provision for mounting icons on the faceplate in order to designate different communication ports in the faceplate as being associated with different communications media such as telephone, fax, modem, printer, etc. The icon mounting provision typically requires a hole in the faceplate through which retention legs of the icon can be inserted. Other faceplates have no provision for mounting icons. Subsequently, installers of communications wiring have to purchase both iconable and non-iconable faceplates in order to satisfy the requirements of different customers who may want a faceplate with or without icons. A problem to be solved is how to provide a single faceplate which can be used either with or without icons while maintaining an attractive appearance.

SUMMARY OF THE INVENTION

The problem is solved by a faceplate for communications equipment comprising a plate member having a front face, a rear face, and a thickness between the front and rear faces. The plate member has an opening for access to a communications port, and an icon mounting stall associated with the opening. The icon mounting stall includes a membrane which is integrally formed in the plate member and is relatively thinner than the plate member, wherein the membrane is puncturable to permit reception of an icon in the mounting stall. In a preferred embodiment the membrane is coplanar with the front face of the plate member and is outlined by a score mark on the front face.

BRIEF DESCRIPTION OF THE DRAWINGS

The invention will be now described by way of example with reference to the accompanying drawings wherein.

DETAILED DESCRIPTION OF A PREFERRED EMBODIMENT

Figure 1:
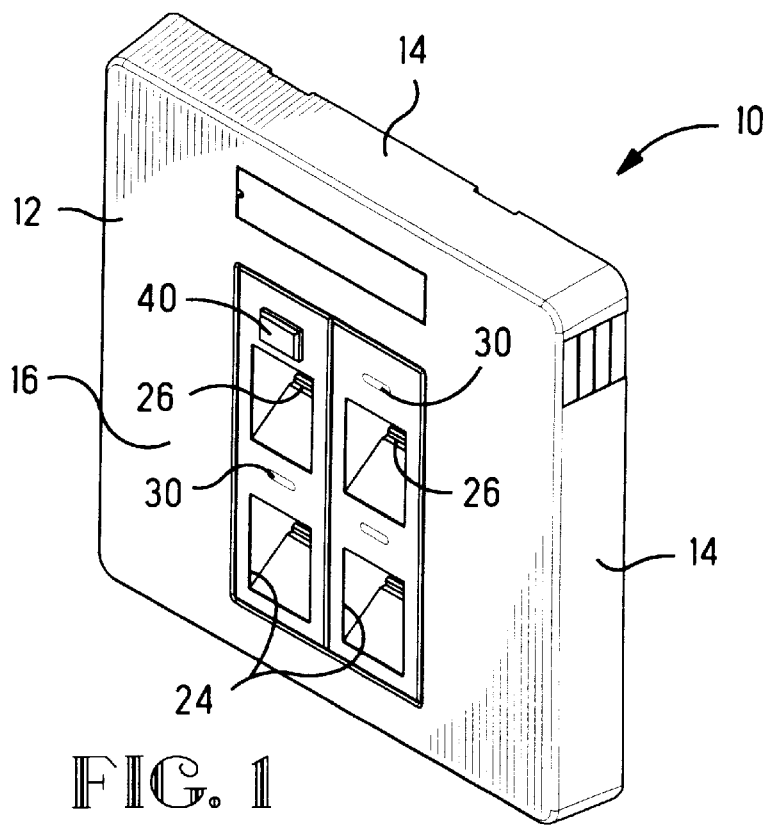
FIG. 1 is a front isometric view of a faceplate according to the invention, and an icon mounted therein.
Figure 2:
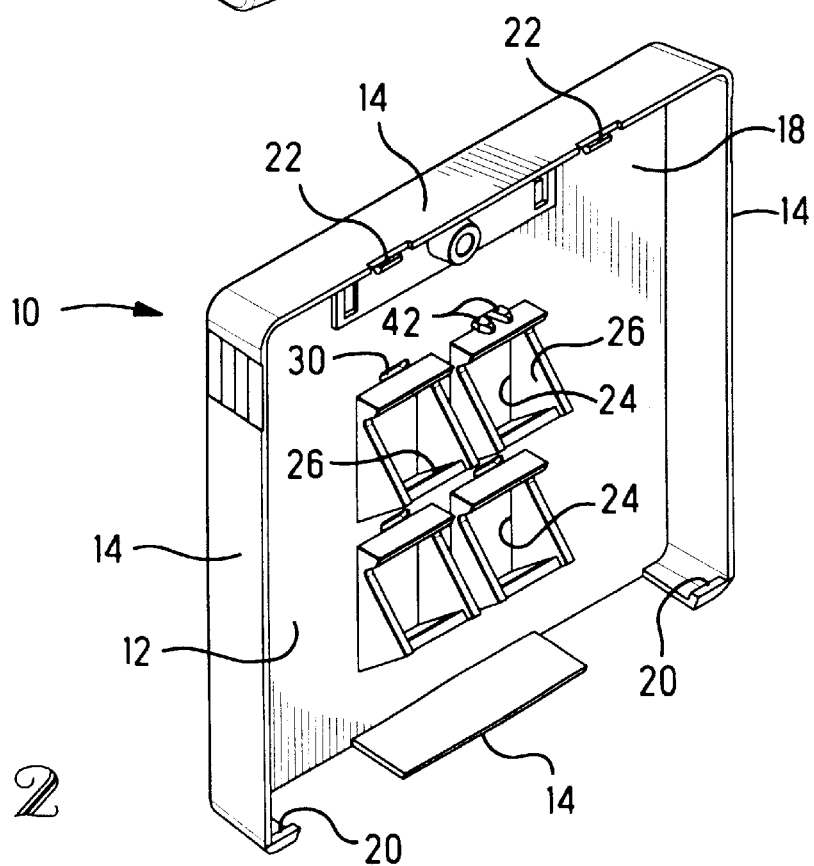
FIG. 2 is a rear isometric view of the faceplate.
Figure 3:
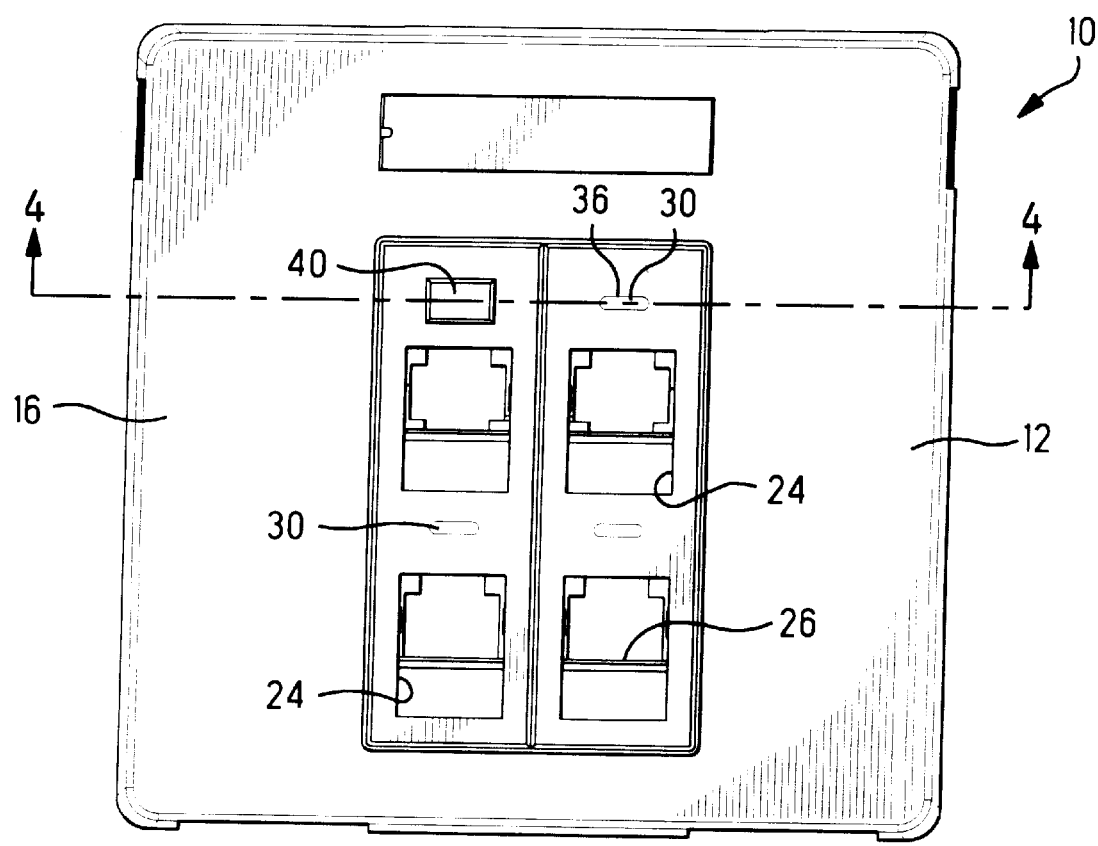
FIG. 3 is a front elevation view of the faceplate.

There is shown in FIGS. 1–3 a faceplate 10 comprising a plate member 12 and sidewalls 14. The plate member 12 has opposite major surfaces that define a front face 16 and a rear face 18 of the plate member. The sidewalls 14 extend rearwardly from peripheral edges of the plate member 12. The sidewalls have latch hooks 20 and latch arms 22 that are cooperable with structural features of communications equipment, such as with edges of a communications outlet box (not shown), to retain the faceplate to the communications equipment.

The plate member 12 has a plurality of openings 24 which provide access from the front of the faceplate to communications ports behind the faceplate. The communications ports may be any of various types such as telephone modular jacks, F-style connectors, BNC connectors and fiber optic connectors. The communications ports may be attached directly to the faceplate 10 or may be mounted in communications equipment behind the faceplate. In the present example the faceplate has receptacles 26 behind the openings 24, and each of the receptacles has grooved walls which are configured to capture an insert (not shown) which holds a communications port so that the communications port is attached directly to the faceplate. However, it should be understood that a faceplate according to the invention need not have integral receptacles for communications ports, but instead can be used in conjunction with communications ports which are mounted independently in equipment behind the faceplate.

The plate member 12 has a number of icon mounting stalls 30 each of which is adjacent to and associated with a respective one of the openings 24. Each of the icon mounting stalls can receive an icon 40 designating a particular communications media, such as telephone, fax, modem or printer, so that the icons can be mounted on the faceplate in the vicinity of corresponding communications ports which are accessed through the openings 24.

Figure 4:
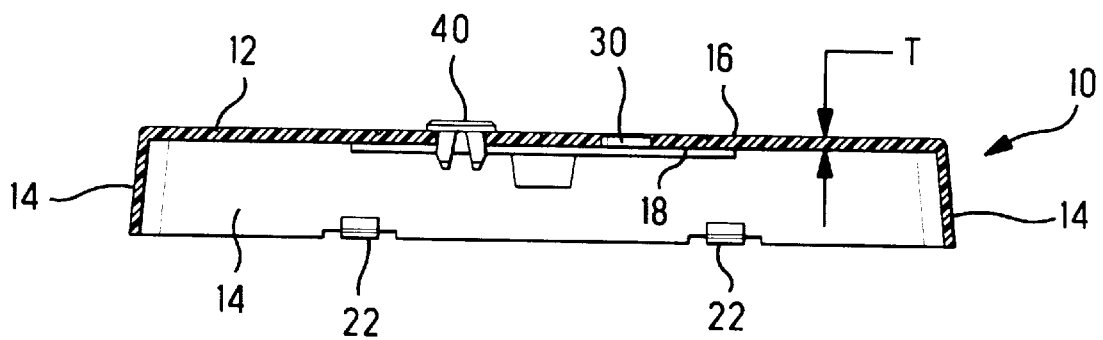
FIG. 4 is a cross-sectional view through the faceplate taken along section line 4—4 in FIG. 3.
Figure 5:
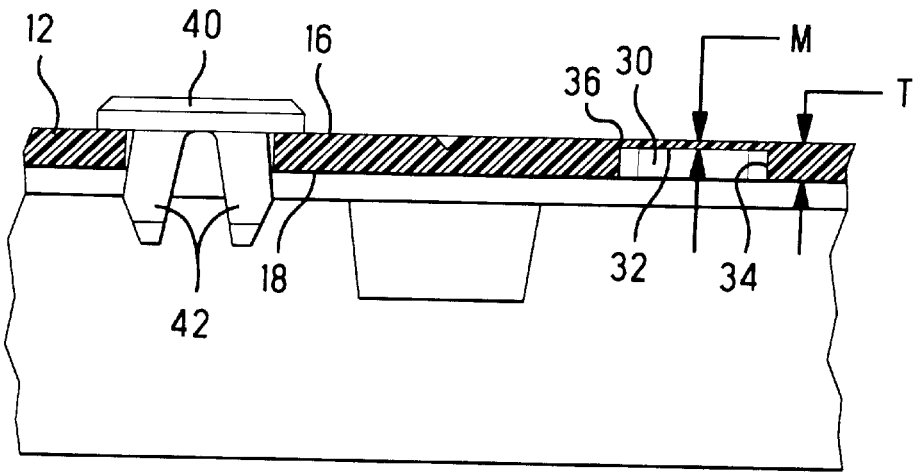
FIG. 5 is an enlarged cross-sectional view showing a portion of the faceplate.

With reference to FIGS. 4 and 5, the plate member has a thickness dimension T between the front face 16 and the rear face 18. The icon mounting stall 30 includes a membrane 32 which is integrally formed with the plate member 12. The membrane 32 has a thickness dimension M which is less that the thickness dimension T of the plate member. The thickness M of the membrane is selected with regard to the material from which the plate member 12 is formed so as to permit the membrane 32 to be punctured with relative ease.

In the illustrated embodiment, the icon mounting stall 30 is specially adapted to receive the icon 40 having a pair of retention legs 42. The icon mounting stall is defined within a cavity 34 in the plate member 12 which is configured to receive the retention legs 42 with a slight interference fit so that the legs are deflected relatively together when the legs are installed in the cavity. The membrane 32, which is formed by a reduced thickness portion of the plate member 12, extends across the cavity 34 and is substantially coplanar with the front face 16 of the plate member. The membrane 32 may be visually distinguished by an identifiable feature on the front face 16 of the plate member so that the location of the icon mounting stall 30 is apparent from the front face. The identifiable feature may be a score mark 36 (FIG. 3) which may be a slight indentation or other indicia on the front face. Alternatively, the identifiable feature may be a change in surface texture of the front face such as by bead blasting or providing a slickened surface on the front face. The membrane 32 can be punctured by applying hand force to the icon 40 so that the retention legs 42 of the icon pierce the membrane and enter the cavity 34. The retention legs are deflected toward each other when the retention legs enter the cavity, thereby frictionally securing the icon to the plate member.

Figure 6:
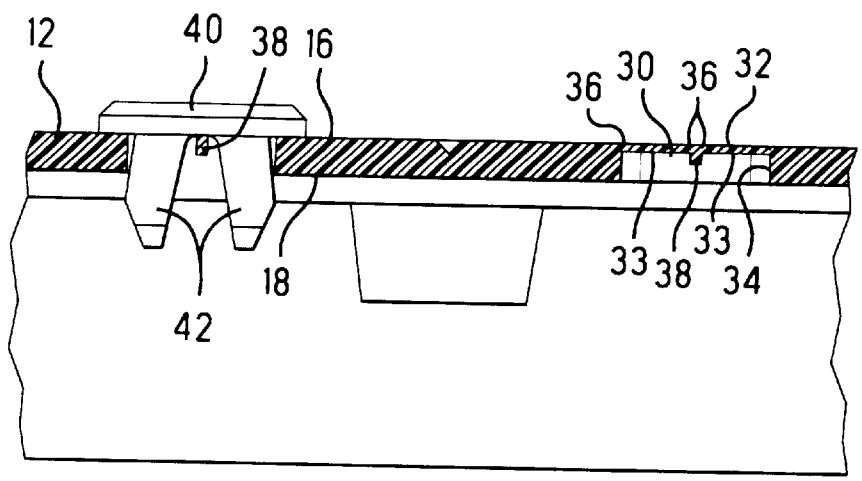
FIG. 6 is an enlarged cross-sectional view showing a portion of the faceplate in an alternate embodiment.

FIG. 6 shows an alternate embodiment wherein the same reference numbers refer to identical features as in the previous embodiment. The faceplate is made from molded plastic material. The plate member 12 has a relatively thin membrane 32 extending across a cavity 34, but the membrane is bifurcated by a rib 38 which is relatively thicker than the membrane. The rib is useful to facilitate molding of the thin plastic membrane. The rib 38 provides a channel from which molten plastic can flow into relatively thin sections 33 of membrane 32 on both sides of the rib. The rib ensures that the membrane sections are formed without cracks or perforations. The retention legs 42 of an icon are used to puncture the membrane sections 33 on both sides of the rib 38, but the rib remains in place when the icon is installed in the cavity 34.

Figure 7:
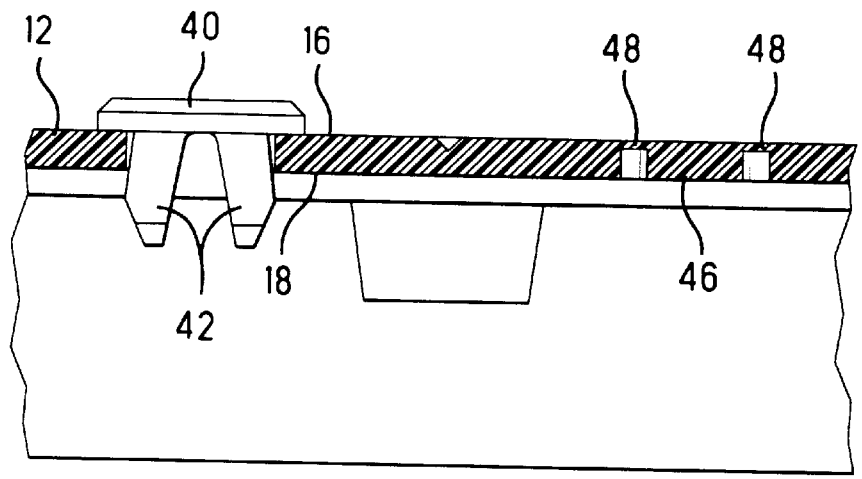
FIG. 7 is an enlarged cross-sectional view showing a portion of the faceplate in still another embodiment.

In an another embodiment as shown in FIG. 7, the plate member 12 has a knockout section 46 which includes a slug of material having the same thickness as the plate member. The knockout section is surrounded by a thin membrane 48 which is connected to the plate member at the front face 16. The knockout section 46 is removed by puncturing the membrane 48, thereby forming a cavity in the plate member which can receive the retention legs 42 of the icon 40.

The invention provides a system for optionally mounting icons in a faceplate. The system eliminates the appearance of empty cavities in the front of a faceplate when the faceplate is used without icons. Thus, an iconable faceplate has an attractive appearance even when used without icons, thereby eliminating the need for a separate non-iconable faceplate.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. A faceplate for communications equipment comprising:
a plate member having a front face, a rear face, and a thickness between the front and rear faces, an opening through the plate member for access to a communications port, and an icon mounting stall associated with the opening, the icon mounting stall including the plate member having an integrally formed membrane which is relatively thinner than the plate member, wherein the membrane is puncturable to permit reception of an icon in the mounting stall.

2. The faceplate according to claim 1, wherein the membrane is coplanar with the front face.

3. The faceplate according to claim 2, wherein the membrane is visually distinguished on the front face.

4. The faceplate according to claim 3, wherein the distinguishing is by a score mark on the front face.

5. The faceplate according to claim 1, wherein the membrane is disposed around a knockout section in the plate member.

6. The faceplate according to claim 1, wherein the membrane extends across a cavity in the plate member.

7. The faceplate according to claim 6, wherein the membrane is bifurcated by a rib which is relatively thicker than the membrane.

8. A faceplate comprising:
a plate member having a front face, a rear face, and a thickness between the front and rear faces, an opening in the plate member for access to equipment, and the plate member having a reduced thickness portion which is puncturable to permit reception of an icon in the plate member.

9. The faceplate according to claim 8, wherein the reduced thickness portion is coplanar with the front face.

10. The faceplate according to claim 9, wherein the reduced thickness portion is visually distinguished on the front face.

11. The faceplate according to claim 10, wherein the distinguishing is by a score mark on the front face.

12. The faceplate according to claim 8, wherein the reduced thickness portion is disposed around a knockout section in the plate member.

13. The faceplate according to claim 8, wherein the reduced thickness portion extends across a cavity in the plate member.

14. The faceplate according to claim 13, wherein the reduced thickness portion is bifurcated by a rib which is relatively thicker than the reduced thickness portion.

15. An icon mounting system comprising:
a plate member having an integrally formed membrane which is relatively thinner than the plate member, wherein the membrane is coplanar with a major surface of the plate member, and the membrane is puncturable to permit reception of an icon in the plate member.

16. The icon mounting system according to claim 15, wherein the membrane is visually distinguished on the major surface.

17. The icon mounting system according to claim 16, wherein the distinguishing is by a score mark on the major surface.

18. The icon mounting system according to claim 15, wherein the membrane is disposed around a knockout in the plate member.

19. The icon mounting system according to claim 15, wherein the membrane extends across a cavity in the plate member.

20. The icon mounting system according to claim 15, wherein the membrane is bifurcated by a rib which is relatively thicker than the membrane.

* * * * *